(12) United States Patent
Houston

(10) Patent No.: US 7,153,756 B1
(45) Date of Patent: Dec. 26, 2006

(54) BONDED SOI WITH BURIED INTERCONNECT TO HANDLE OR DEVICE WAFER

(75) Inventor: Theodore W. Houston, Richardson, TX (US)

(73) Assignee: Texas Instruments Incorporated, Dallas, TX (US)

(*) Notice: Subject to any disclaimer, the term of this patent is extended or adjusted under 35 U.S.C. 154(b) by 0 days.

(21) Appl. No.: 09/346,436

(22) Filed: Jul. 1, 1999

Related U.S. Application Data
(60) Provisional application No. 60/095,293, filed on Aug. 4, 1998.

(51) Int. Cl.
H01L 21/76 (2006.01)
H01L 21/4763 (2006.01)

(52) U.S. Cl. .................... 438/455; 438/622
(58) Field of Classification Search ......... 438/404–413, 438/455, 459, 622
See application file for complete search history.

(56) References Cited

U.S. PATENT DOCUMENTS

| | | | |
|---|---|---|---|
| 3,787,822 A | * | 1/1974 | Rioult .................. 340/173 SP |
| 5,087,585 A | * | 2/1992 | Hayashi .................. 437/51 |
| 5,260,233 A | * | 11/1993 | Buti et al. .................. 438/455 |
| 5,573,972 A | * | 11/1996 | Kobayashi .................. 437/63 |
| 5,880,010 A | * | 3/1999 | Davidson .................. 438/455 |
| 6,183,588 B1 | * | 2/2001 | Kelly et al. .................. 156/247 |

* cited by examiner

Primary Examiner—Erik Kielin
(74) Attorney, Agent, or Firm—Wade James Brady, III; Frederick J. Telecky, Jr.

(57) ABSTRACT

A method of fabricating an electrically conductive via and an SOI structure and the structure. A substrate and a device wafer are provided and an electrically insulating layer having an outer face is formed on one of the substrate or device wafer. The insulating layer has an electrical interconnect structure therein, a portion extending to the outer face of the insulating structure. The outer surface of the insulating layer is bonded to the other of the substrate or device wafer. A portion of the insulating layer can be disposed between the interconnect structure and at least one of the substrate or device wafer with ultimate interconnection made by applying a voltage across the portion of the insulating layer sufficient to break down the portion of the insulating layer while maintaining the integrity of the remainder of the SOI structure. At least one of the device layer and substrate includes a bond region with the interconnect structure contacting the bond region. A portion of the interconnect structure can be buried within the insulating layer as a separate layer therein. As an alternate embodiment, a planar surface can be formed having areas of the device layer and areas of the insulating layer and that surface can be bonded to a substrate wafer. As a still further embodiment, a layer of electrically insulating material is formed having a surface and an edge is formed extending from the surface through the layer of insulating material. A layer of electrically conductive material is formed on the edge and a patterned etch is provided to selectively remove the conductive material from the edge, leaving the material where the conducting via is desired. Then additional insulating material is deposited and the surface is planarized.

2 Claims, 1 Drawing Sheet

BONDED SOI WITH BURIED INTERCONNECT TO HANDLE OR DEVICE WAFER

This application claims priority under 35 USC §119(e)(I) of provisional application No. 60/095,293 filed Aug. 4, 1998.

FIELD OF THE INVENTION

This invention relates to a method and structure for making an interconnect between a device layer and a handle wafer which forms the substrate through a buried oxide for bonded silicon on insulator (SOI) structures.

BRIEF DESCRIPTION OF THE PRIOR ART

In the fabrication of bonded (SOI) devices, the normal process flow includes forming of an electrically insulating layer over a device wafer with bonding of the electrically insulating layer to a handle wafer which forms the substrate. The device wafer is then thinned down to a device level thickness.

It is known that two essentially coplanar surfaces of layers of silicon and/or silicon dioxide which are in contact with each other can be bonded together by first placing the two layers in contact with each other whereby the two layers are held together by van der Waals forces. The bond strength is increased by applying an annealing step which apparently causes some migration of atoms between the two layers in the immediate region of the contacting surfaces to cause the bonding. This procedure has been used to fabricate bonded silicon on insulator (SOI) structures with devices formed in the device silicon layer separated by a silicon dioxide layer from the substrate silicon layer with each of the silicon layers being coplanar with opposing surfaces of the silicon dioxide layer with the bond interface at either of the silicon/silicon dioxide interfaces or within the silicon dioxide layer. Preferably, the bond interface is at the substrate/silicon dioxide interface. Structures such as interconnect may be included within the silicon dioxide layer, and dopant may be implanted into the substrate through the device and silicon dioxide layers.

In the prior art, whenever connection was to be made between the device layer and the substrate, the procedure has involved initial etching through an area of the device layer with subsequent etching through the electrically insulating layer to the substrate. Interconnect material would then be formed in the etched away region. This procedure takes up device surface area and requires the ability to reliably form the interconnect in the etched vias extending through both the device layer and the electrically insulating layer which can be difficult for thick dielectric layers. In addition, since fabrication takes place from the outer surface of the device layer, it is not possible to have a connection to just the inner surface of the device layer. Furthermore, there is no provision for utilizing the electrically insulating layer for anything other than as a dielectric separator.

SUMMARY OF THE INVENTION

In accordance with the present invention, there is provided a method and structure whereby not only is there provided an easily fabricated interconnect between the device layer and the substrate, but, in addition, there is the capability of providing buried structures within the electrically insulating layer connecting to both the substrate and the device layer without consuming outer surface area of the device layer.

Briefly, a dielectric layer is formed on the handle wafer and/or the device wafer. Interconnect structures are included in the dielectric layer(s), optionally connecting to the device wafer of handle wafer, and optionally extending to the outer surface of the dielectric layer. There is flexibility to form interconnect with high aspect ratio (depth to cross-sectional area) traversing the dielectric layer. Optionally, device and/or alignment structures may be formed in the device wafer, dielectric layer(s), or handle wafer. The bonding surfaces are planarized as necessary, such as with spin on glass (SOG), resist etch back (REB) and/or chemical/mechanical polish (CMP), such that the opposing bonding surfaces are sufficiently conformal so that the van der Wall's forces described above come into play when the wafers are aligned and brought into close proximity. The bonding step then takes place by standard techniques. A portion of the device wafer is removed to provide the desired device layer thickness, again by standard techniques. Devices are then formed in the device layer.

In the above, a portion of the interconnect structure in the dielectric layer is completed at the bonding interface. Preferably, the bonding interface is between the dielectric layer and the handle wafer, and connection is made from an interconnect structure in the dielectric layer to the handle wafer. Optionally, the bonding interface is between the dielectric layer and the device wafer, and connection is made from an interconnect structure in the dielectric layer to the device wafer. As a further option, the bonding interface is between a dielectric layer formed on the device wafer and a dielectric layer formed on the handle wafer, and connection is made between interconnect structures in each of the dielectric layers. In each case, optionally, a thin dielectric layer may be formed between an interconnect structure and the bonding interface, either inadvertently or to facilitate bonding. Then a sufficiently high voltage is applied across this thin dielectric to cause breakdown and completion of the interconnection. The voltage can be applied at any point after the bonding, including immediately after bonding, after device wafer thinning, after initial patterning of the device layer, and after packaging of the completed integrated circuit.

It can be seen that, in accordance with the current invention, there is provided a method for fabrication of SOI structures wherein electrical connection can be made across a bonding interface without requiring etching through the outer surface of the device layer. Further, there is flexibility in forming an interconnect traversing the dielectric layer.

DESCRIPTION OF THE PREFERRED EMBODIMENT

Figure 1:
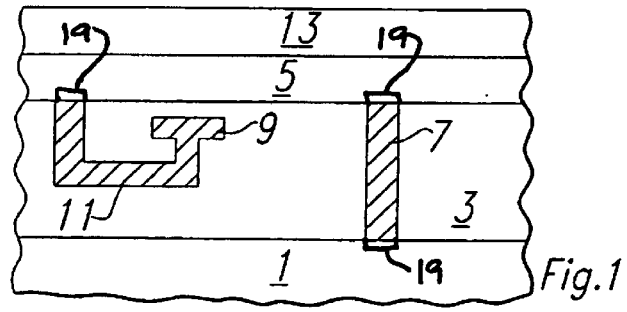
FIG. 1 is a cross sectional view of a first embodiment of a structure fabricated in accordance with the present invention.

Referring first to FIG. 1, there is shown an SOI structure in accordance with a first embodiment of the present invention. The structure includes a handle wafer 1 which forms the substrate, and electrically insulating layer 3. Optionally, the dielectric layer 3 is formed in the handle wafer and bonded to the device wafer, or formed on the device wafer and bonded to the handle wafer. The device wafer 5 and the substrate 1 may have active and/or passive devices formed therein optionally making connection to an interconnect in the electrically insulating layer. The electrically insulating layer 3 may include therein interconnect structures 7 interconnecting the device wafer 5 to the substrate 1. The electrically insulating layer 3 can also have, with or without the above described interconnect structure, passive elements 9, such as, for example, inductors, with an interconnect 11 to the device wafer 5 and/or the substrate 1 to the passive elements.

The structure of FIG. 1 is fabricated by providing each of a handle wafer 1 and a device wafer 5. A dielectric layer 3 is formed on one of handle wafer 1 or device wafer 5, with interconnect extending to the outer surface of dielectric 3 with or without an interconnect passing entirely therethrough 7 and/or one or more passive elements buried therein 9 and/or on a surface thereof (not shown) and/or interconnect 11 between the passive elements and one or both opposed surfaces of the electrically insulating layer. The interconnects 7 and 11 are connected to bond regions 19. Optionally, alignment marks are formed in the dielectric layer 3 and/or in the device wafer 5 and/or the handle wafer 1. The outer surface of dielectric layer 3 is planarized, such as with combined use of a flowable dielectric and CMP. The interconnect initially extending to the outer surface of dielectric layer 3 is optionally covered with a thin dielectric after planarization. Also, a thin dielectric, such as a native oxide, may be formed on the wafer to which dielectric layer 3 is to be bonded. The one of handle wafer 1 or device wafer 5 on which the dielectric is formed is then bonded to the other of the device wafer and handle wafer by standard means. The device layer 5 is then thinned back to the phantom line 13 with fabrication then continuing in standard manner to provide a completed device. The interconnect 7 will generally contact to source, drain or body regions of the device subsequently fabricated in device layer 5, or to interconnect formed on the outer surface of device layer 5. In the event a thin native oxide has developed over the device wafer 5 or the substrate 1 or the flowable dielectric insulates the interconnect in the electrically insulating layer from the substrate or device wafer, a sufficiently high voltage can be passed through the circuitry involving the interconnect 7 to cause breakdown of the native oxide or other dielectric and allow completion of the connection as is well known in the art. Optionally, the voltage can be applied prior to completion of fabrication of devices in device layer 5.

Figure 2:
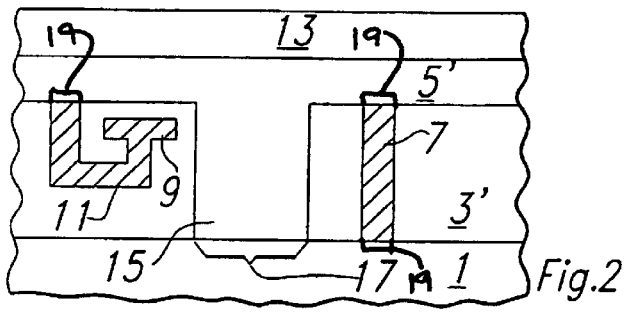
FIG. 2 is a cross sectional view of a second embodiment of a structure fabricated in accordance with the present invention.

Referring to FIG. 2 wherein like reference numbers refer to the same or similar structures, there is shown a structure which is the same as in FIG. 1 and fabricated in the same manner except that the device layer includes a mesa portion 15 of the device wafer 5' which extends through the electrically insulating layer 3' and makes contact with the substrate 1. Connection can be made directly between the substrate 1 and the device wafer 5 as well as through the electrically insulating layer 3. As shown, other interconnection between the device wafer 5' and the substrate 1 can be made with an interconnect 7 as in FIG. 1 and other interconnect 11 and/or passive elements 9 can be formed as discussed above with reference to FIG. 1.

For the structure of FIG. 2, silicon-to-silicon bonding can be accomplished simultaneously with the dielectric to silicon bonding. Optionally, a thin oxide may be formed in region 17 prior to bonding and subsequently broken down with application of a sufficiently high voltage.

Figure 3:
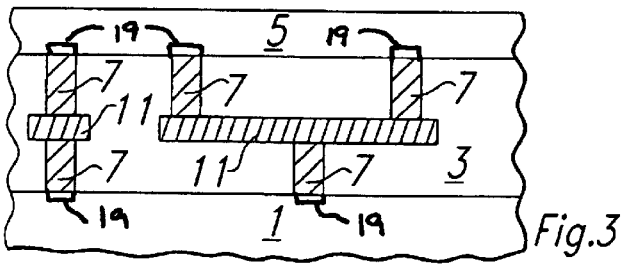
FIG. 3 is a cross sectional view in accordance with a second embodiment of the present invention.
Figures 4, 5:
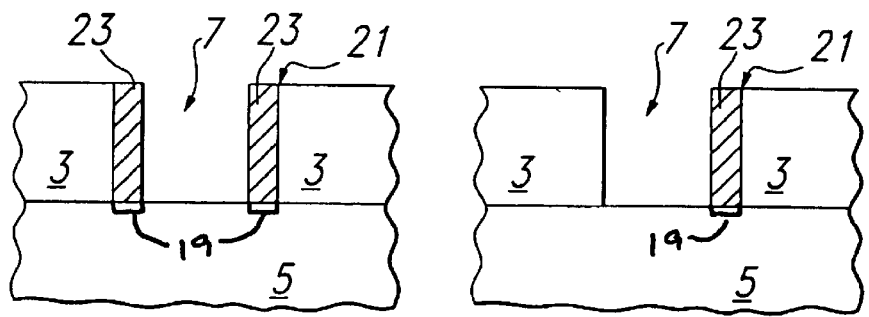
FIG. 4 is a cross sectional view in accordance with a third embodiment of the present invention.
FIG. 5 is a cross sectional view in accordance with a fourth embodiment of the present invention.
Figure 6:
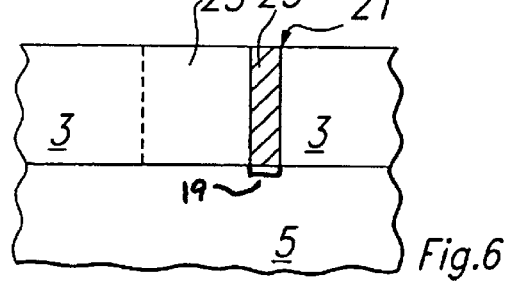
FIG. 6 is a cross sectional view of a subsequent portion of the process flow in fabrication of the embodiments of FIGS. 4 and 5.

Formation of a via through a relatively thick dielectric layer as may be used for the dielectric layer between the device wafer and the handle wafer can be difficult with standard process techniques. Forming a via or vias 7 through the dielectric 3 prior to bonding provides flexibility. One option is to form the dielectric 3 in layers with multiple levels of interconnect 11 as illustrated in FIG. 3. Another alternative is illustrated in FIGS. 4 and 5. Dielectric layer 3 is formed, and a pattern is etched through the dielectric layer 3 to the underlying device wafer 5, forming an edge 21 where the via is to be. A sidewall of interconnect material 23 is formed on the edge as illustrated in FIGS. 4 and 5. The sidewall 23 is then selectively etched, if required, using patterned resist, leaving the interconnect material at the via location as illustrated in FIGS. 4 and 5. Additional dielectric material 25 is subsequently deposited and planarized in the via 7, as illustrated in FIG. 6.

Various dielectric materials or composites thereof can be used to form layer 3, such as, for example, grown oxides, deposited oxides, and nitrides. Also, various conductive materials can be used to form the interconnect, such as polysilicon, amorphous silicon and tungsten. With low temperature bonding, additional materials, such as aluminum, can be used. Stacked materials, such as tungsten with titanium nitride at the interfaces can also be used. Silicides can be formed at the interconnect to wafer interface.

Though the invention has been described with reference to specific preferred embodiments thereof, many variations and modifications will immediately become apparent to those skilled in the art. For example, the invention may incorporate multiple layers of bonding. It is therefore the intention that the appended claims be interpreted as broadly as possible in view of the prior art to include all such variations and modifications.

I claim:

1. A method of fabricating an SOI structure which comprises the steps of:

(a) providing a substrate having at least one of active or passive elements on a surface thereof;

(b) providing a device wafer having at least one of active or passive elements on a surface thereof;

(c) forming an electrically insulating layer having a pair of opposed outer faces, one of said opposed outer faces disposed on a said surface of one of said substrate or said device wafer, said electrically insulating layer having an electrical interconnect structure disposed therewithin, a portion of said interconnect structure extending substantially to said one of said outer faces of said electrically insulating structure to make electrical contact with a device in at least one of the device wafer and the substrate; and (d) then bonding the other of said outer faces of said electrically insulating layer to the said surface of the other of said substrate or device wafer;

further including the steps of forming an electrical insulation on at least one of said electrically insulating layer, said substrate or said device wafer insulating said interconnect structure from said device in said at least one of the device wafer and the substrate and applying a voltage across said electrical insulation to break down said electrical insulation and provide interconnection between said interconnect structure and said device.

2. A method of forming an SOI structure, comprising the steps of:
- providing a device layer having at least one of active or passive elements on a surface thereof;
- providing a substrate having at least one of active or passive elements on a surface thereof;
- providing an electrically insulating layer having an interconnect structure disposed therein and extending to a surface thereof;
- forming a substantially planar region on said surface of said device layer and said surface of said substrate;
- forming a substantially planar region on said surface of said electrically insulating layer;
- interposing said electrically insulating layer between said device layer and said substrate with said planar region of said electrically insulating layer overlaying said substantially planar region on said at least one of said surface of said device layer and said surface of said substrate to make electrical contact with a device in at least one of the device wafer layer and the substrate; and
- then bonding said planar surface region of said electrically insulating layer to said overlying one of said substrate and said device layer,
- further including the steps of forming an electrical insulation on at least one of said electrically insulating layer, said substrate or said device wafer layer and the substrate and applying a voltage across said electrical insulation to break down said electrical insulation and provide interconnection between said interconnect structure and said device.

* * * * *